United States Patent [19]

Adlerstein

[11] Patent Number: 4,474,623

[45] Date of Patent: Oct. 2, 1984

[54] METHOD OF PASSIVATING A SEMICONDUCTOR BODY

[75] Inventor: Michael G. Adlerstein, Wellesley, Mass.

[73] Assignee: Raytheon Company, Lexington, Mass.

[21] Appl. No.: 371,857

[22] Filed: Apr. 26, 1982

[51] Int. Cl.³ .................. H01L 21/265; H01L 21/205; B01J 17/00

[52] U.S. Cl. ...................... 148/1.5; 29/571; 29/579; 148/187; 357/15; 357/50

[58] Field of Search ............. 148/1.5, 187; 29/571, 29/579; 427/84–87; 357/15, 50

[56] References Cited

U.S. PATENT DOCUMENTS

| | | | |
|---|---|---|---|
| 3,886,580 | 5/1975 | Calviello | 357/15 |
| 3,923,975 | 12/1975 | Calviello | 427/84 |
| 3,982,267 | 9/1976 | Henry | 357/52 |
| 4,062,103 | 12/1977 | Yamagishi | 29/580 |
| 4,075,650 | 2/1978 | Calviello | 357/15 |
| 4,098,921 | 7/1978 | Calviello | 427/53 |
| 4,110,488 | 8/1978 | Risko | 427/84 |
| 4,157,610 | 6/1979 | Kamei et al. | 29/571 |
| 4,172,906 | 10/1979 | Pancholy | 427/82 |
| 4,197,557 | 4/1980 | Adlerstein | 357/15 |
| 4,210,472 | 7/1980 | Hoffmann et al. | 148/187 |
| 4,317,125 | 2/1982 | Hughes et al. | 357/15 |
| 4,375,125 | 3/1983 | Byatt | 29/588 |

OTHER PUBLICATIONS

Foyt et al., Solid St. Electronics, 12 (1969) 209.
Favennec et al. in Ion Implantation in Semiconductors ... ed. Crowder, Plenum, NY, 1973, p. 621.
Spicer et al., Phys. Rev. Letts. 44 (1980) 420.

*Primary Examiner*—Upendra Roy
*Attorney, Agent, or Firm*—Denis G. Maloney; Joseph D. Pannone; Richard M. Sharkansky

[57] ABSTRACT

A method for forming a protective layer from surface portions of a mesa-shaped semiconductor to electrically isolate a junction region formed within the semiconductor from external contaminants. A top contact electrode is formed on an upper surface of a substrate. An active region, having formed therein the junction, is formed on the bottom portion of the substrate. A support is then formed on the active region. The top contact is first used as an etching mask, and a chemical etchant is brought into contact with unmasked portions of the substrate to form a mesa-shaped structure with divergent side walls. The divergent side walls have bottom portions which include the active region and which extend beyond the periphery of the top contact electrode. The top contact is next used as an implant mask and particles are implanted in exposed portions of the side walls extending beyond the periphery of the top contact electrode to convert the exposed semiconductor material into the protective layer.

12 Claims, 7 Drawing Figures

METHOD OF PASSIVATING A SEMICONDUCTOR BODY

BACKGROUND OF THE INVENTION

This invention relates to methods for manufacturing semiconductor structures and more particularly to methods for protecting exposed junctions formed in active regions of such semiconductor structures.

As is known in the art it is often desirable to protect exposed junctions formed in active regions of a semiconductor structure from ambient air to contaminants which otherwise may result in changes in electrical characteristics of the structure or failure of devices formed in such structure. Specifically, the air or contaminant particles present on the surface produce surface charges. Such surface charges may result in short circuits across the exposed junction. One technique for providing protection to the junction is to deposit a passivating layer on the exposed surface portion of the junction. This prior art technique presents a significant disadvantage because by depositing a passivating layer on the surface portions of the semiconductor any ambient air or contaminant particles present on the semiconductor surface during formation of such passivation layer will be trapped between the surface of the semiconductor and the deposited passivating layer. The trapped air or contaminant particles still produce surface charges which may result in short circuits across the junction. It is also well known that active regions of certain semiconductor materials such as gallium arsenide (GaAs), may be rendered semi-insulating by ion implantation of particles, such as protons (H+) or oxygen ions (O+). There are two distinct physical mechanisms by which ion implantation of particles into portions of a crystal renders such portions semi-insulating. One mechanism is the effect of the impact of such particles on the crystal's lattice structure, since high energy particle impact damages the lattice structure thereby decreasing the electrical conductivity thereof. The second mechanism is the effect of the implanted particles on excess, or free, electrons since implanted particles, such as O+, act as carrier trap sites which combine with the excess, or free electrons, to provide a net zero charge. Thus the exposed areas of such junctions are rendered semi-insulating and are effectively electrically isolated from the remaining portions of such active regions. Thus, exposure of such formed semi-insulating regions to air or containments will not effect the electrical properties of the remaining electrically isolated portions of such active regions, and hence will substantially prevent one cause of device failure. Generally, implantation depths of 1-2 microns are achieved with high-energy ion beams (i.e. beams having energies greater than 1 million electron volts). A prior art method for rendering portions of the active regions of mesa shaped semiconductors semi-insulating generally includes the following steps: forming a plurality of first contacts on one surface of a substrate; forming an active layer on the opposite surface of such substrate; masking selective portions of the active layer by providing a like plurality of areas of photoresist on such active layer, each area being aligned with a corresponding one of such first contacts on the opposite surface of the substrate; and implanting particles into unmasked portions of the active layer rendering all of such unmasked portions semi-insulating. At this point a support layer is formed over the active layer and the substrate is etched away in selective locations to provide the mesa-shaped semiconductors having semi-insulated surface portions. While this prior art approach may be useful in some applications the step of patterning the layer of photoresist to provide the plurality of areas of photoresist on such active layer, aligned with the top contacts, requires a front to back alignment of the pattern mask with the top contacts. This alignment step is a difficult step which increases processing time and decreases device yield. Further, the maximum depth of penetration by an implant beam of the active region is generally only 1 to 2 microns which is generally sufficient to render semi-insulating thin active layers (1 to 2 microns thick) associated with high frequency semiconductors, but is generally insufficient to render semi-insulating thicker active regions (3 to 6 microns) such as those associated with lower frequency devices.

SUMMARY OF THE INVENTION

In accordance with the present invention, a semi-insulating protective layer is formed from peripheral portions of a junction in a mesa-shaped crystal, semiconductor structure. A top contact electrode is used as an etching mask, and selective portions of such structure are etched away to form the mesa-shaped semiconductor with divergent side walls. The mesa-shaped semiconductor structure thus formed has an exposed peripheral portion of the junction which extends beyond the periphery of such top contact. The top contact electrode is next used as an implant mask, and particles are implanted into the exposed peripheral portion of the junction. The conductivity of the implanted portion is reduced, thus providing the protective layer. With such an arrangement, an active junction is rendered semi-insulating since the outer peripheral surface portion of the junction is implanted with particles which damage the crystal lattice of the semiconductor and thereby reduce the conductivity of such surface portions. Further by using the top contact as both an etching mask and an implant mask, front to back alignment of the implant mask with the etching mask is eliminated thus simplifying the fabrication of a self-passivated mesa-shaped structure.

In accordance with an additional aspect of the present invention a method of forming a protective layer from a selective portion of a material having a first region, and a second region includes the steps of: etching selective portions of such first and second regions to expose a portion of such second region extending beyond the periphery of the first region; masking a portion of the first region; and implanting particles into the extended portions of such exposed second region and into unmasked portions of the first region decreasing conductivity of such implanted regions. The protective layer is thus formed from such implanted regions. With such an arrangement by implanting portions of the exposed surface of the second region, the conductivity of any thickness of second region is reduced. Further, by converting surface portions of the material into the lower conductivity protective layer, any surface contaminants present on such material will not degrade the protection of such material provided by the reduced conductivity of the protective layer.

BRIEF DESCRIPTION OF THE DRAWINGS

For a better understanding of the invention reference is made in the following detailed description to the drawings wherein:

FIG. 2 is a cross sectional view of FIG. 2A taken along line 2—2;

DESCRIPTION OF THE PREFERRED EMBODIMENT

Figure 1:
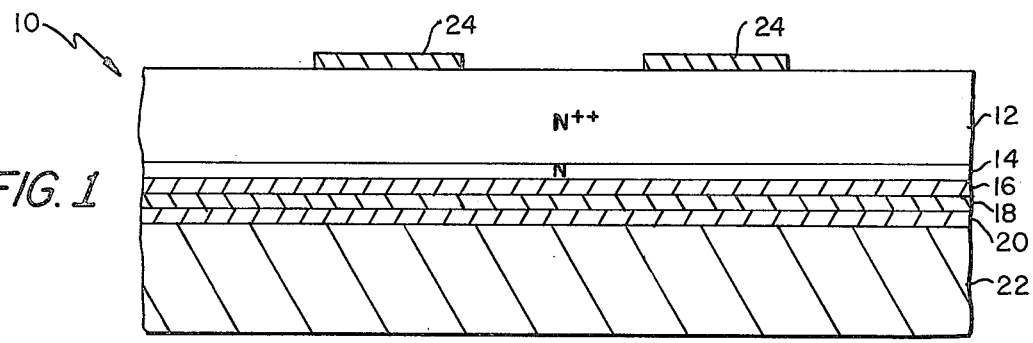
FIGS. 1-3 are a series of cross-sectional views showing steps in the construction of mesa-shaped diodes having a semi-insulating layer on extended portions of the surface of such mesa-shaped diodes.

Construction of a plurality of semiconductor devices having a portion of the surface of each of such devices converted into a protective layer in accordance with the teachings of the present invention will be described in conjunction with the cross-sectional views of FIGS. 1 through 3. Referring first to FIG. 1, a wafer 10 is shown to include a thinned substrate 12, here N++ doped gallium arsenide (GaAs), having on a bottom surface thereof an active layer 14, here an N type, epitaxially grown, semiconductor layer of GaAs. Active layer 14 may have one of many different doping density profiles depending upon the desired electrical characteristics for the diode. Here, for example, a doping density profile described in my U.S. Pat. No. 4,160,992, issued July 10, 1979 and assigned to the assignee of this invention is used. A junction 13 is formed between the active layer 14 and a first metallic layer 16, here of platinum (Pt), which is sputtered upon the surface of active layer 14 to a thickness in the range of 100 Angstroms (A) to 200 A. A second metallic layer 18, here of titanium (Ti), is sputtered over the platinum layer 16 to a thickness in the range of 1000 A to 2000 A. A highly electrically and thermally conductive layer 20 here gold (Au) is evaporated on layer 18 to a thickness in the range of 1000 A to 2000 A. Next, a second thermally and electrically conductive layer 22, here gold is plated on the first thermally and electrically conductive layer 20 to a thickness generally in the range of 12 to 20 microns. Such layer 22 provides a support for the wafer during mesa etch and serves as a heatsink and electrical contact for individual ones of such mesa-shaped diodes 30 after fabrication and dicing. Top contacts 24, here of gold, are formed on the upper surface of the substrate 12, using well known photoresist masking and gold plating techniques. The top contacts 24 are used as an etching mask to define those areas of the substrate 12 where the mesa shaped diodes 30 are formed.

Figure 2:
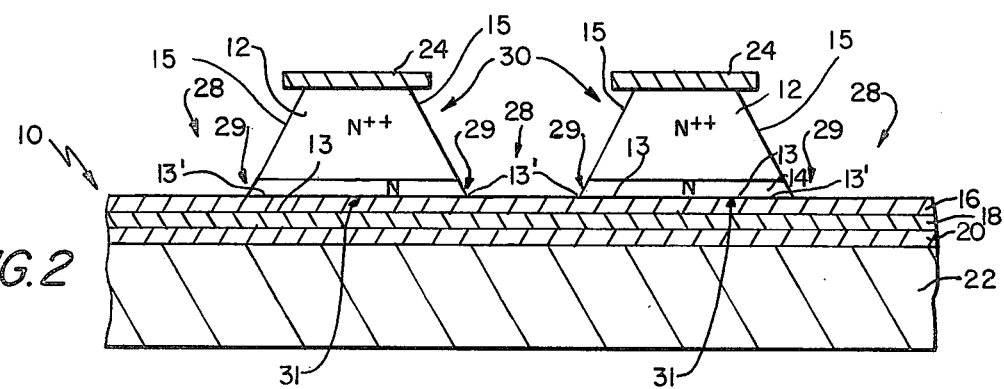

Referring now to FIG. 2, a plurality of mesa shaped diodes 30 is shown formed from selective portions of the substrate 12. The top contacts 24 formed on the upper portion of the substrate 12, as described above, provide an etching mask for etching of the substrate 12. An isotropic chemical substrate etchant, here a solution of sulfuric acid ($H_2SO_4$), hydrogen peroxide ($H_2O_2$), and water ($H_2O$) in a ratio of 3:1:1 is brought into contact with the unmasked portions of the upper surface of the substrate 12, and selective portions 28 of the substrate 12 are thereby etched away in a manner now to be described, to provide the plurality of mesa-shaped diodes 30 with divergent sidewalls 15. The wafer 10 is placed in a bath (not shown) of the chemical etchant which contacts and etches away the unmasked portions 28 of the substrate 12, as shown. The portions 28 the substrate 12 are etched away until the mesa-shaped diodes 30 have divergent sidewalls 15 with extended base regions 29, as shown. Each extended base region 29 includes portions of the active layer 14 and portions of the etched substrate 12. The junction 13 includes exposed peripheral junction portions 13' extending beyond the periphery of the top contact. Each extended base region 29, and exposed peripheral junction portion 13' extends beyond the periphery of the corresponding top contact 24 formed on each one the mesa-shaped diodes 30. It is to be noted that each mesa-shaped diode 30 is formed such that the diameter of the base portion 31 thereof including the active layer 14 and exposed peripheral junction portion 13' forming such base portion 31, is larger than the corresponding diameter of such top contact 24. The etching process is monitored by techniques to be described, to determine when such selective portions 28 of the substrate 12 have been sufficiently etched away to provide the mesa-shaped diodes 30 having extended base regions 29, as shown. One technique to monitor the formation of such mesa-shaped diodes 30 is to monitor the value of capacitance of one or more of the mesa-shaped diodes 30 as they are formed, until a predetermined value of capacitance of such mesa-shaped diodes 30 is obtained. A second technique to monitor the formation of such mesa-shaped diodes 30 is to view the wafer 10 from the top contact side (FIG. 2A) through a suitable microscope (not shown) to observe when the diameter of such base region 31 has a predetermined diameter. As will be described, in order to ensure proper subsequent implantation of the active layers 14 of such mesa-shaped diodes, such active layers 14 must extend beyond the periphery of the top contacts 24 such that the top contacts 24 do not mask the active layers 14, during the implant step to be described in conjunction with FIG. 3.

Figure 2A:
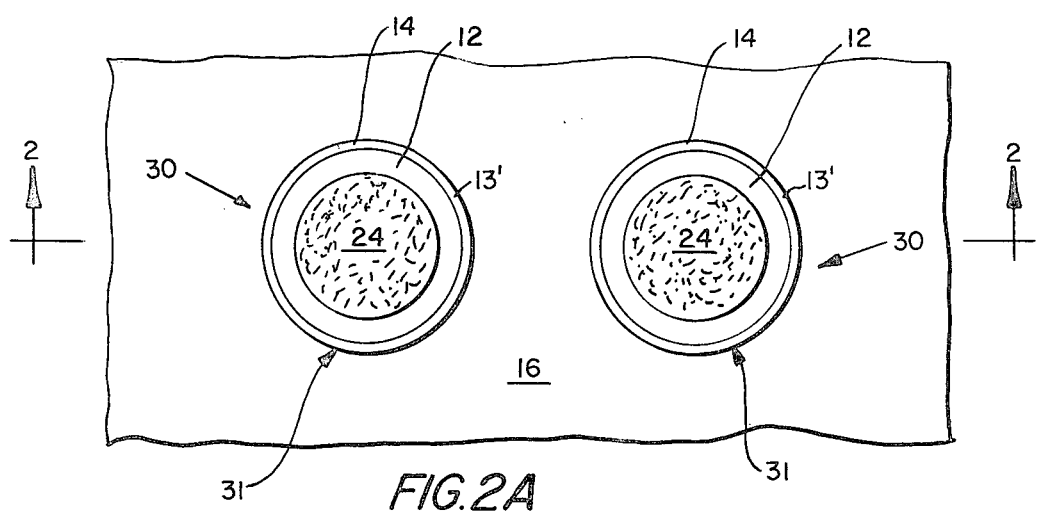
FIG. 2A is a top view of the mesa-shaped diodes at the stage of processing shown in FIG. 2.

Referring now to FIG. 2A, portions of the substrate are etched away until the base 31 of such mesa shaped diode 30 is surrounded by a continuous portion of the metallic layer 16 on the active layer 14 and exposed peripheral junction portion 13' are extended byeond the periphery of the top contact 24.

Figure 3:
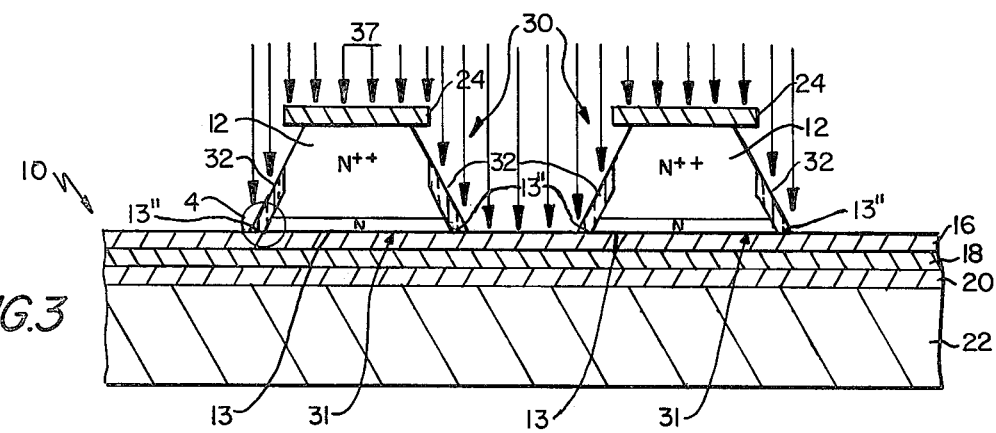

Referring now to FIG. 3, the wafer 10 of mesa-shaped diodes 30 is placed in a suitable apparatus (not shown) for forming a protective layer 32 from surface portions of the extended base region 29 and the portion of the semiconductor region previously providing the exposed peripheral portions portions 13'. Here, a preferred method for converting surface portions of the mesa shaped diode 30 into the protective layer 32 includes the steps of placing the wafer 10 of mesa-shaped diodes 30 in an ion implantation apparatus (not shown); and implanting a stream 37 of ion implant particles such as protons (H+) or oxygen ions (O+) into the surface of the extended portions 29 of the mesa-shaped diodes 30, such stream 37 here being directed to the surface of the wafer 10 at an incident angle, here substantially normal to surface of the top contact 24. The particles are not implanted into the portions of the mesa-shaped diode 30 masked by the top contact 24. Thus, here the top contact 24 serves as an implant mask during ion implantation to form the protective layer 32. Implanting particles of H+ or O+, for example, into surface portions of the previously provided exposed peripheral junction portions 13' damages the crystal lattice structure thereof, providing the converted junction portions 13" of the protective layer 32. The lattice structure damage provides a decrease in the conductivity of such protective layer 32. Further, the implanted particles of $O^+$, for example, embedded in the damaged lattice structure, provide carrier traps sites for either free carriers produced as a result of the lattice damage, or excess electrons previously present in the crystal. These trap sites further reduce the conductivity of the lattice structure. Generally, providing traps in an undamaged lattice structure such as may be accomplished either by implanting particles having energy levels insufficient to damage such structure, or by annealing a damaged structure after implanting to cure such damage, provides the protective layer 32 having reduced conductivity. Further, implanting particles to create a damaged lattice structure without carrier traps, likewise reduces the conductivity of such area providing the protective layer 32. Implantation depths of 0.25 microns to 1.0 microns are generally sufficient to provide such protective layer 32.

Figure 4:
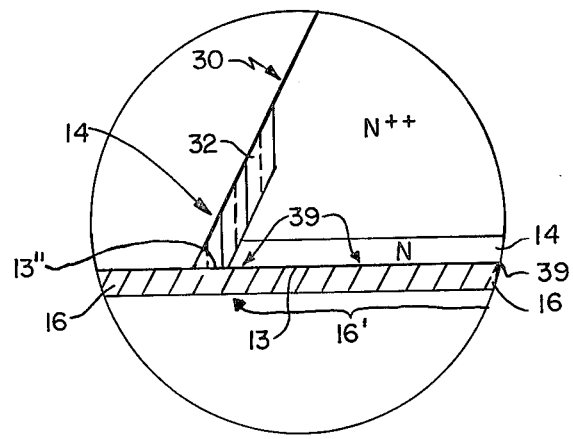
FIG. 4 is a detail view of the junction provided by the active layer, as shown in FIG. 3.

Referring now to FIG. 4, the junction 13 is provided by the N-type doped region 14 and a Schottky barrier contact 16' here a portion of the metal layer 16. This type of diode structure is often referred to as a Schottky barrier diode. Such a diode provides a region 39 of high electric field intensity confined to a small portion of the N-type region 40, and terminated at the barrier contact surface 16'. The protective layer 32 formed from implanted surface portions of the mesa-shaped diode 30 provides the converted exposed peripheral junction portions 13" of the N-type material to which the high field region is confined.

Figure 5A:
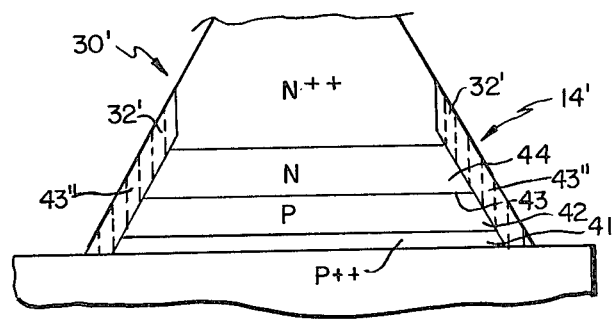
FIGS. 5A-5B are detail views of junctions provided by alternate types of active layers.
Figure 5B:
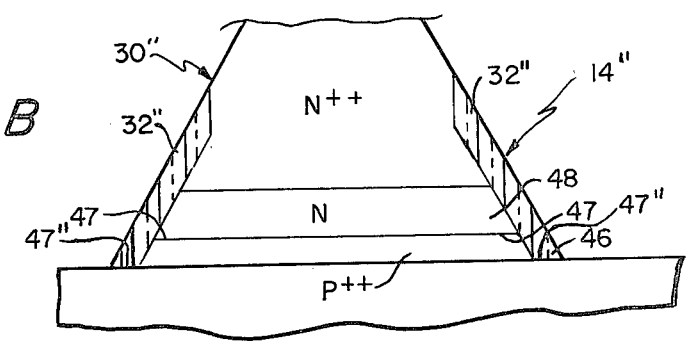

Referring now to FIGS. 5A, 5B alternate diode active region structures 14' and 14" here providing, as often referred to as a double drift diode 30' (FIG. 5A), and a single drift diode 30" (FIG. 5B) respectively, are shown. The double drift diode 30' (FIG. 5A) includes a P++ type doped layer 41, a P-type doped region 42, and a N-type doped region 44 formed thereon, as shown. The interface of layers 42, 44 form a junction 43. Junction 43 providing a converted exposed peripheral junction portion 43", as shown. The region of highest electric field is substantially confined to the area of the junction 43. A protective layer 32' is shown formed from the surface portions of the P-type material 42 and N-type material 44, electrically isolating the converted exposed peripheral junction portion 43' and hence the high field region to the interior portions of the mesa-shaped diode 30. The single drift structure 30" (FIG. 5B) here includes a thin P++ type layer 46 and an N-type layer 48 formed thereon, such regions 46, 48 forming a junction 47. Junction 47 previously providing a converted exposed peripheral junction portion 47". Here again, the region of high electric field intensity is substantially confined to the area of the junction 47. A protective layer 32" likewise is provided from surface portions of layer 46 and layer 48 effectively confining the converted exposed peripheral junction portion 47" and hence the high field region to the interior portion of the mesa-shaped diode 30".

It is to be noted that here the surface portion of the active layer 14, included in the extended base portion 29, is rendered semi-insulating, whereas in the prior art, a depth portion of the active layer is rendered semi-insulating. Thus here the junction region is exposed and such exposed junction region is converted into the protective layer. The present technique of passivating is not implant depth limited. Thus, unlike the prior art methods, this technique may also be used to passivate those thicker layers generally associated with lower frequency devices.

Having described preferred embodiments of the invention it will now be apparent to one of skill in the art that other embodiments incorporating its concept may be used. It is believed therefore that this invention should not be restricted to the disclosed embodiments, but rather should be limited only by the spirit and scope of the appended claims.

What is claimed is:

1. A method for forming a semiconductor structure comprising the steps of:
   providing a semiconductor with a junction region therein;
   exposing peripheral portions of the junction;
   shadowing a first surface portion of the semiconductor; and
   implanting particles into an unshadowed second portion of the semiconductor and exposed peripheral portions of the junction to convert such semiconductor portion and exposed peripheral junction portion into a protective layer.

2. A method of forming a protective layer over electric field regions of a semiconductor device comprising the steps of:
   forming an active region in a first surface portion of a crystal substrate, such active region having therein the electric field region;
   masking selective portions of such substrate on a second surface opposite the first surface portion to provide a masked area thereon;
   etching the unmasked portions of such substrate on such second surface thereon to form the semiconductor device with an exposed portion of the electric field region extending beyond such masked area;
   shadowing portions of the substrate; and
   implanting particles into an unshadowed portion of the substrate and exposed portion of such electric field region to provide the protective layer.

3. The method recited in claim 2 wherein the step of implanting further comprises the step of:
   providing regions of crystal damage in the unshadowed extended portion to provide the protective layer.

4. The method recited in claim 2 wherein the step of implanting further comprises the step of:
   providing carrier trap sites in the crystal structure of the unshadowed extended portion to provide the protective layer.

5. A method of forming a protective layer comprising the steps of:
   forming an active region in a first surface portion of a substrate;
   forming an electrode contact on a second surface opposite the first surface of such substrate;
   using the electrode contact firstly as an etch mask, to etch portions of such substrate, forming a structure aligned with such electrode contact and having surface portions extending beyond the periphery of such electrode contact;
   implanting particles into the extended surface portions rendering such portions semi-insulating; and using the electrode contact secondly to shadow portions of the semiconductor underlying such electrode contact from the implanted particles.

6. A method of passivating comprising the steps of:
   forming an active region having a junction region therein, in a first surface of a substrate;
   forming an electrode contact on a second surface of such substrate;
   etching portions of the substrate using such electrode contact as a mask to form a mesa-shaped structure;
   exposing peripheral junction portions of such structure extending beyond the periphery of such electrode contact; and
   implanting particles into such exposed peripheral junction portions of such structure to passivate the structure using such electrode contact as a mask to shadow unexposed junction portions of such structure.

7. The method as recited in claim 6 wherein the step of implanting further comprises the step of:
   providing regions of crystal damage in the exposed peripheral junction portion of said structure.

8. The method as recited in claim 6 wherein the step of implanting further comprises the step of:
   providng carrier trap sites on the exposed peripheral junction portions of said structure.

9. A method comprising the steps of:
   masking a portion of a first region of a crystal structure;
   etching unmasked portions of the first region of the structure exposing portions of a second region of such structure extending beyond the mask; and
   implanting particles into the exposed extended surface portion of the second region to reduce the conductivity thereof.

10. The method as recited in claim 9 wherein the step of implanting further comprises the step of:
    providing regions of crystal damage in the exposed surface portion of the second region.

11. The method as recited in claim 9 wherein the step of implanting further comprises the step of:
    providing carrier trap sites in the exposed surface portion of the second region.

12. A method for providing a semiconductor having a protective layer comprising the steps of:
    providing a substrate having a junction region;
    masking the substrate in a selected region;
    etching unmasked portions of the substrate;
    providing exposed peripheral surface portions of the junction region which extend beyond the masked region; and
    directing a beam of ion particles toward the etched substrate to implant said particles into the exposed peripheral surface portions of the junction region.

* * * * *